United States Patent [19]
Funhoff et al.

[11] Patent Number: 5,518,824
[45] Date of Patent: May 21, 1996

[54] ELECTROLUMINESCENT ARRANGEMENT

[75] Inventors: Dirk Funhoff, Heidelberg; Karl Siemensmeyer, Frankenthal; Lukas Häussling, Laubenheim; Karl-Heinz Etzbach, Frankenthal; Dietrich Haarer; Juergen Simmerer, both of Bayreuth, all of Germany

[73] Assignee: BASF Aktiengesellschaft, Ludwigshafen, Germany

[21] Appl. No.: 284,220

[22] Filed: Aug. 2, 1994

[30] Foreign Application Priority Data

Aug. 2, 1993 [DE] Germany .................. 43 25 885.9

[51] Int. Cl.$^6$ ............................................. H05B 33/02
[52] U.S. Cl. .................. 428/690; 428/917; 445/24; 427/551; 427/558; 313/502; 313/506
[58] Field of Search ..................... 428/690, 917, 428/691; 445/24; 427/87, 248 B, 248 E, 248 J, 255, 157; 313/502, 506; 156/611, 612; 118/49

[56] References Cited

U.S. PATENT DOCUMENTS

| | | | |
|---|---|---|---|
| 4,539,507 | 9/1985 | VanSlyke et al. | 313/504 |
| 4,720,432 | 1/1988 | Vanslyke et al. | 428/457 |
| 4,769,292 | 9/1988 | Tang et al. | 422/690 |
| 5,126,214 | 6/1992 | Tokailin et al. | 428/690 |

FOREIGN PATENT DOCUMENTS

| | | |
|---|---|---|
| 0357443 | 3/1990 | European Pat. Off. . |
| 443861 | 8/1991 | European Pat. Off. . |
| WO88/04467 | 6/1988 | WIPO . |
| WO90/13148 | 11/1990 | WIPO . |
| WO92/03490 | 3/1992 | WIPO . |
| WO92/03491 | 3/1992 | WIPO . |

*Primary Examiner*—Charles R. Nold
*Attorney, Agent, or Firm*—Oblon, Spivak, McClelland, Maier & Neustadt

[57] ABSTRACT

In an electroluminescent arrangement containing one or more organic layers, at least one of the layers is obtained by thermal or radiation-induced crosslinking and at least one charge-transporting compound is present per layer. The novel arrangements are very suitable, for example, for the production of displays.

20 Claims, 1 Drawing Sheet

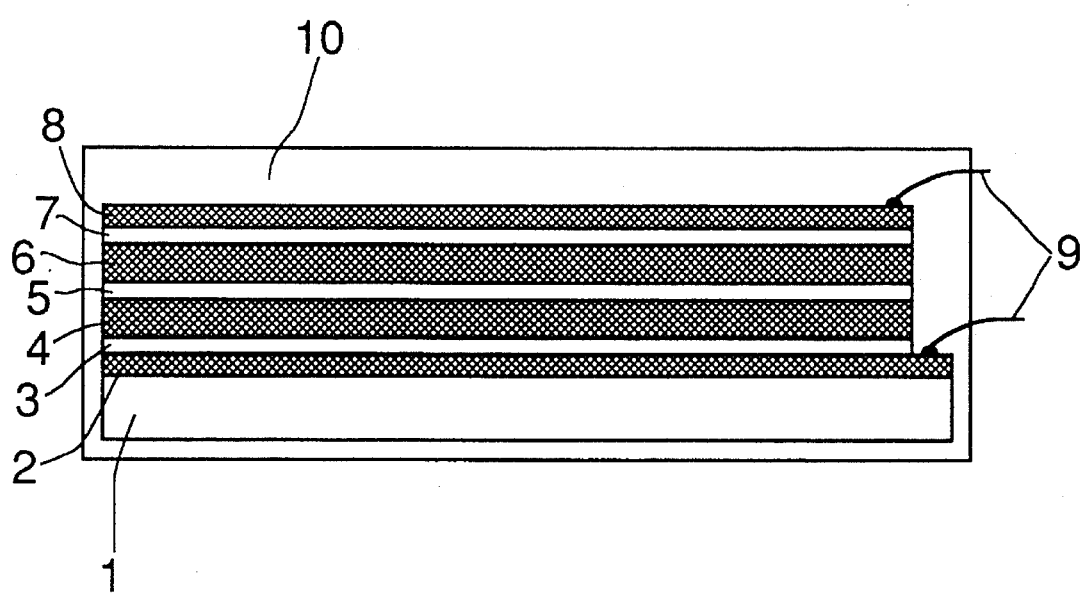

ELECTROLUMINESCENT ARRANGEMENT

BACKGROUND OF THE INVENTION

An electroluminescent (EL) arrangement emits light under the application of an electric voltage, with a flow of current. Such arrangements have long been known in industry as light emitting diodes (LEDs). The emission of light arises because positive charges (holes) and negative charges (electrons) combine with emission of light.

FIELD OF THE INVENTION AND DESCRIPTION OF THE PRIOR ART

The LEDs usually used in industry all consist predominantly of inorganic semiconductor materials. However, EL arrangements whose essential components are organic materials have been known for some years.

These organic EL arrangements contain, as a rule, one or more layers of organic charge transport compounds. The structure is shown in principle in the FIGURE. The numbers 1 to 10 have the following meanings:
1 Substrate
2 Base electrode
3 Hole-injecting layer
4 Hole-transporting layer
5 Emitter layer
6 Electron-transporting layer
7 Electron-injecting layer
8 Top electrode
9 Contacts
10 Encapsulation This structure represents the most general case and may be simplified by omitting individual layers, so that one layer performs a plurality of tasks. In the simplest case, an EL arrangement consists of two electrodes between which an organic layer which performs all functions, including that of light emission, is located. Such systems are described, for example, in the application of WO 9013148 and are based on poly-[p-phenylenevinylene].

SUMMARY OF THE INVENTION

The present invention relates to the arrangements which are described in the claims and contain one or more layers 3–7 which may also be combined with regard to their function. In the structure of the EL arrangement, it is possible, for example, to dispense with the electron conductor layer and the electron-injecting layer. The EL arrangement would then consist of, for example, the layers 3 to 5 in addition to the electrodes and the substrates.

DESCRIPTION OF THE PREFERRED EMBODIMENTS

According to the invention, charge transport compounds are understood as meaning all compounds which transport charges (holes and/or electrons) in any manner. They expressly include those compounds which are components of the emitter layer, ie. photoluminescent materials, such as fluorescent dyes.

The literature describes a large number of organic compounds which transport charges (holes and/or electrons). Low molecular weight substances which are applied, for example, by vapor deposition under greatly reduced pressure are predominantly used. A good review of the classes of substances and their use is given, for example, by EP-A-387715, U.S. Pat. Nos. 4,539,507, 4,720,432 and 4,769,292. In principle, it is possible to use, for example, all substances which are known photoconductors in electrophotography.

The common feature of all these EL arrangements which are based on low molecular weight compounds is that they do not have a sufficient operating life. During operation, the organic light emitting diodes become very hot (>100° C.), and this leads to a change (extending to destruction) of the layers, so that there is then a reduction in performance or complete loss of function.

When polymers are used in EL arrangements, these problems should occur to a lesser extent. However, not many layers containing polymers have been described. Thus, Japanese Preliminary Published Application 4028197 describes, for example, an EL arrangement which contains polyvinylcarbazole as a component of the emitter layer. Soluble polymers, such as polyvinylcarbazole are applied by casting or spin coating using dilute solutions. The disadvantage of this process is that it is not possible to apply a plurality of layers of this type since the solvent for the second layer partially dissolves or at least partially swells the first layer. This then leads to mixing of the two layers at the interface and hence to a reduction in the efficiency. These problems are described in detail in U.S. Pat. No. 4,539,507.

It should also be noted that the thermal stability of polymer layers is limited not only chemically (decomposition) but also physically by their glass transition temperature or melting point.

Further examples of the use of polymers in EL arrangements are poly[p-phenylenevinylene] (PPV) and polyimides. The use of PPV in EL arrangements is described in EP-A-443861, WO-A-9013148, 9203490 and 9203491. The high thermal stability of the PPV, which is furthermore insoluble, may be mentioned as an advantage.

Polyimide layers are obtained by vapor deposition of corresponding comonomers under greatly reduced pressure and subsequent thermal formation of the polyimide (cf. EP-A-449125). These polymers are also insoluble.

For applications in the EL sector (in particular displays), this insolubility is a disadvantage owing to the fact that photostructurability is thus no longer possible. Moreover, the thermal treatment of the substrate, which treatment is required for the production of the polymers, limits the choice of substrates to those substrates which are stable at high temperatures, for example glass.

It has been found that the disadvantages described can be avoided with the novel EL arrangements. The structure of these EL arrangements corresponds in principle to the diagram shown in the FIGURE, where, as stated above, the number of organic layers can be reduced if individual layers perform a plurality of functions.

In the novel layer structure of the EL arrangement, the components of the individual layers are crosslinked thermally or particularly preferably with actinic radiation (UV light, visible light, electron beams or X-rays). First, a suitable substrate is coated. Examples of suitable substrates are glasses and films which are provided with a conductive coating and are mechanically stable. The substrate and the electrodes should exhibit very little absorption at the wavelength of the emitted light. As a rule, a corresponding solution which contains the charge transport compounds in addition to further, optional components, such as binders, reactive diluents, crosslinking agents and thermal initiators or photoinitiators, is applied to a substrate by spin coating or knife coating and, after possible drying, the resulting film is crosslinked thermally or, particularly preferably, by means of actinic radiation. The advantage of the latter embodiment is that the substrate is subjected to scarcely any thermal stress. In any case, depending on the planned structure, the next layer may be applied immediately after the crosslinking. Owing to the formation of an insoluble polymeric network in the layer just treated, mixing of the freshly applied layer with the already crosslinked layer cannot occur. In the case of radiation-induced crosslinking, the layer or layers can of course also be structured by imagewise exposure by known methods, and unexposed parts can be removed by washing out. Photostructurable systems based on crosslinking are known in industry (printing plates, photoresists).

The combination of crosslinked and uncrosslinked layers which are obtained in a known manner, for example by vapor deposition or knife coating and, if required, subsequent fixing, is also possible.

According to the invention, all compounds which transport charges in any manner (holes and/or electrons) may be used as charge-transporting compounds in the layers. As stated above, these include expressly those compounds which are components of the emitter layer, ie. are photoluminescent materials, such as fluorescent dyes. Particularly suitable compounds are those which carry groups capable of anionic, cationic or, preferably, free radical polymerization. Charge transport compounds which carry groups capable of photocycloaddition are also preferred.

The following may be mentioned as parent structures: tertiary aromatic amines, oxadiazoles, thiadiazoles, benzoxazoles, benzotriazoles, phthalocyanines, fused aromatic systems, such as perylenes, pyrenes or coronenes, or polyene compounds which preferably additionally carry groups capable of cationic or free radical polymerization or groups capable of photocycloaddition. Such compounds are preferably introduced into the layers 3, 4, 6 and 7 or in combinations thereof. It is also possible to use dyes which have groups capable of anionic, cationic or, preferably, free radical polymerization or groups capable of photocycloaddition. The resulting polymeric networks are preferably used as layer 5.

Examples of suitable charge transport compounds are:

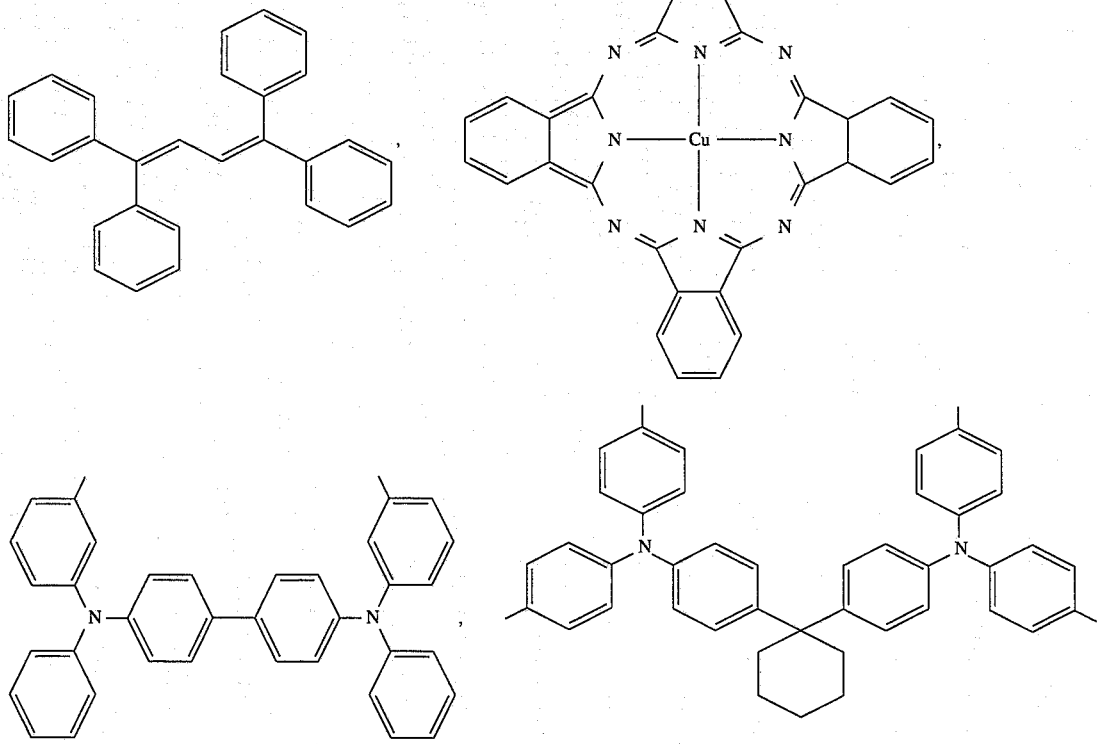

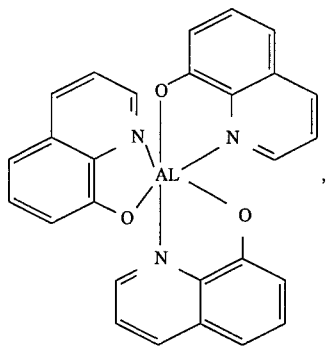
,
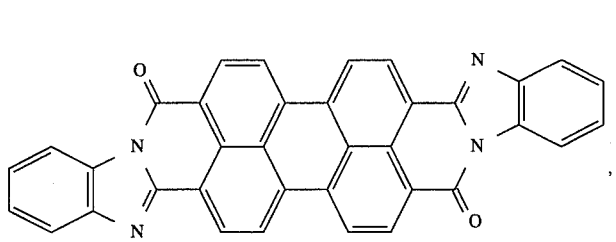
,

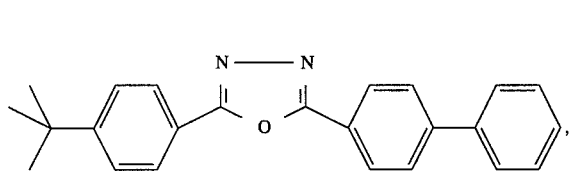
,
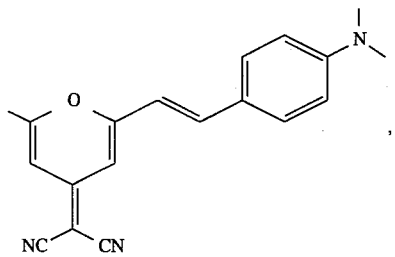
,

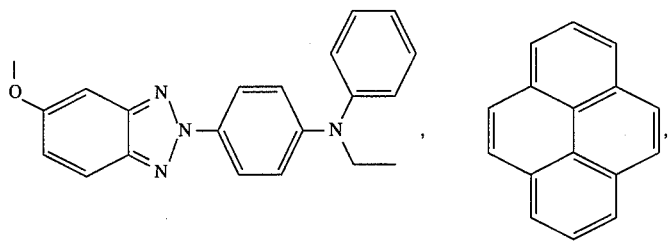
,

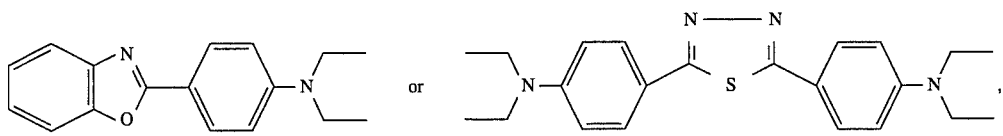

where these compounds may furthermore carry substituents, preferably $C_1$–$C_4$-alkyl, methoxy, ethoxy or cyano.

Groups capable of free radical polymerization are those in which the polymerization is initiated by means of free radicals. Particular examples of such groups are vinylcarbonyl compounds, such as acrylates, methacrylates or maleic acid derivatives.

Groups capable of cationic polymerization are understood as being groups which react with protic acids or Lewis acids with formation of polymers. Examples of such compounds are vinyl ethers and epoxides.

Compounds capable of anionic polymerization are, for example, cyanoacrylates, methacrylates or styrene.

Of course, one or more groups capable of anionic, cationic or, preferably, free radical polymerization may be bonded to a charge-transporting molecule. The use of more than one group capable of anionic, cationic or free radical polymerization is preferred since network formation takes place more readily.

Examples of such compounds are:

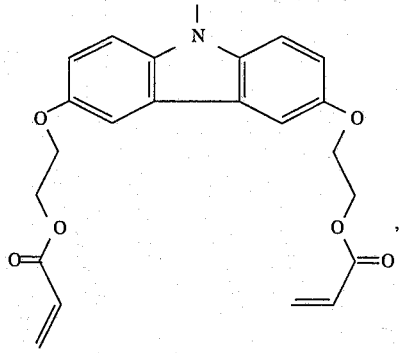
,
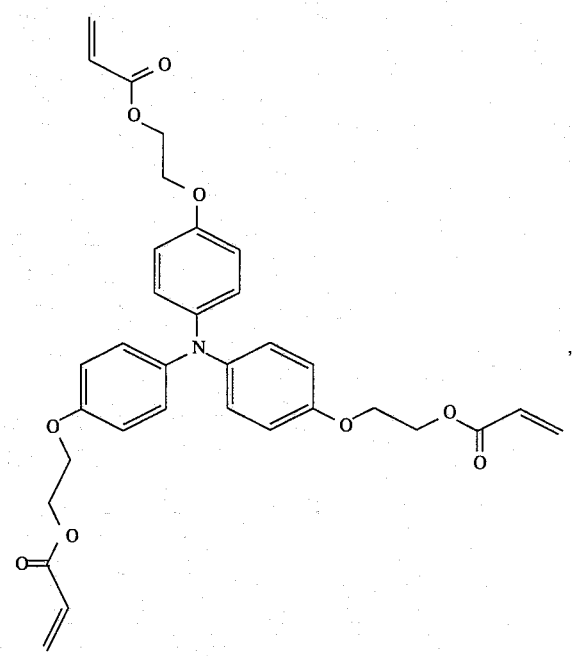
,
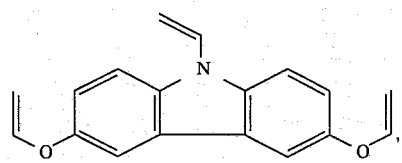
,
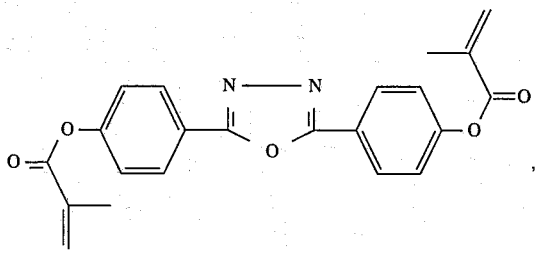
,
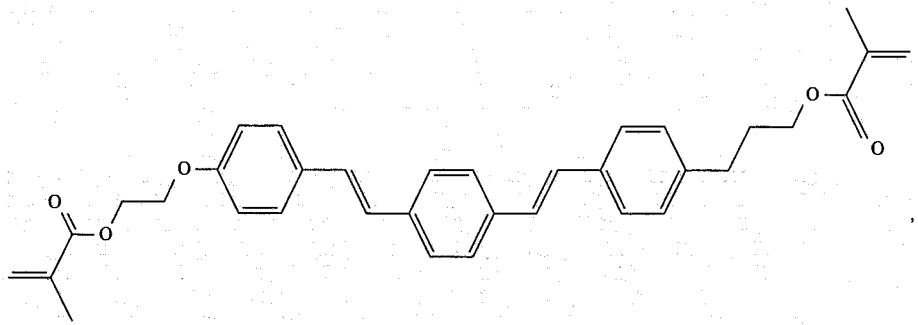
,
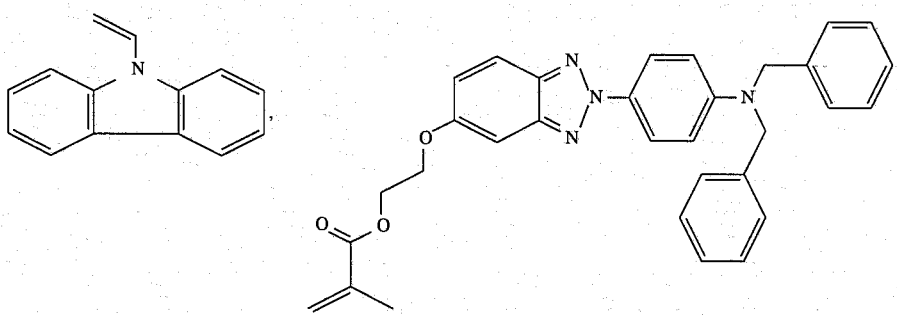
,

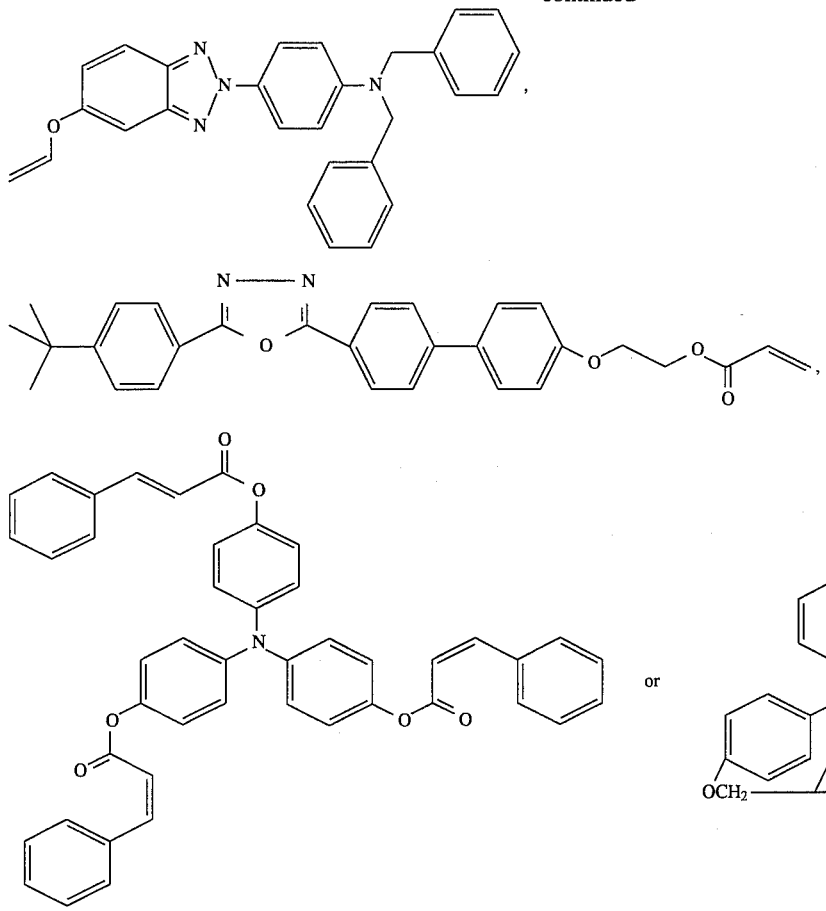

where these compounds too may furthermore carry substituents, preferably the abovementioned ones.

Side groups capable of photocycloaddition are also preferred as substituents for the novel charge transport compounds. Examples of such side groups are:

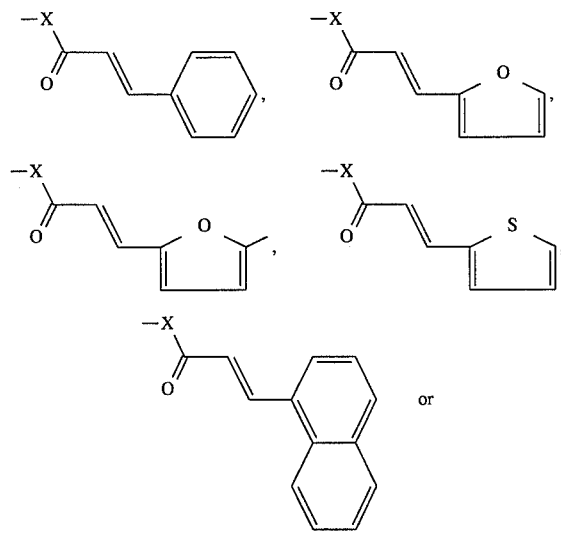

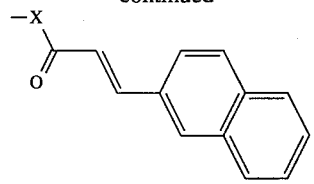

where X is O or NR and the radicals may be further substituted, for example by methyl or methoxy, and R is hydrogen or $C_1$–$C_6$-alkyl, preferably methyl or ethyl.

Instead of standard substituents leading to crosslinking, it is also possible to use combinations of the various crosslinkable substituents on a charge transport molecule. For example, a group capable of free radical crosslinking, such as an acrylate, as well as a group capable of photocycloaddition, for example a cinnamic acid derivative, may be present on a charge transport molecule.

In addition to the charge transport compounds, the solutions for the production of the novel layers may, as stated above, furthermore contain, for example, (thermal and photochemical) initiators, binders, reactive diluents, crosslinking agents and leveling agents, which are known to the skilled worker from coating technology.

Where the charge transport compounds have no crosslinkable groups, ie. if they do not participate in network formation, the stated additives must form the insoluble network in which the charge transport compounds are then fixed.

Soluble polymers which carry crosslinkable side groups, as already stated for the charge transport compounds, ie. acrylates, methacrylates or maleic acid derivatives, vinyl ethers or epoxides or groups capable of photocycloaddition, are then also advantageously used as binders. An example of a polymer having side groups capable of photocycloaddition is poly-[ vinyl cinnamate].

For the production of the novel layers, the charge-transporting compounds are advantageously dissolved, with or without a cationic or free radical initiator, binder and reactive diluent, in a solvent in which they are readily soluble, and the solution is applied by means of a knife coater or a spin coater to the substrate already coated with an electrode. After evaporation of the solvent, which may be accelerated by gentle heating, the resulting film is crosslinked by means of actinic radiation or by heating. The corresponding methods (for example UV curing, electron beam curing) are known from coating technology and have no special features in comparison with those methods; usually, energies of from 0.3 to 1 MeV are used at UV wavelengths of from 200 to 450 nm and in the case of electron beams. In the crosslinking effected by radiation, the layers can be directly structured, which is important, for example, for the production of displays. This is effected, as a rule, similarly to the methods known from resist technology.

The crosslinked layer obtained is thermally stable and insoluble and has high mechanical strength. Depending on the embodiment desired, further layers or the second electrode directly may be applied in a similar manner, for example by vapor deposition. Such EL arrangements have particularly good heat resistance.

EXAMPLE 1

5 g of vinylcarbazole are dissolved, together with 0.1 g of the compound of the formula

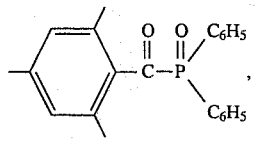

2 g of polyvinylcarbazole and 2 g of trimethylolpropane triacrylate, in 200 ml of methoxypropanol. This solution is applied by means of a spin coater to a glass sheet coated with conductive ITO (indium tin oxide). This sheet is then heated on a hotplate for 3 minutes at 90° C. The layer thickness after drying is 240 nm.

The layer obtained is then exposed for 10 minutes to a high pressure mercury lamp (HBO). This causes crosslinking, and the layer is then insoluble in methoxypropanol.

An emitter layer is then applied to this layer. For this purpose, a solution of 0.01 g of DCM (cf. Example 2) and 0.99 g of poly-[vinyl cinnamate] in 30 ml of toluene is applied by spin coating, dried and crosslinked by exposure to an HBO lamp. The layer thickness is 190 nm.

The layers are then dried for one hour at 100° C. under reduced pressure in a drying oven.

An aluminum electrode is used as the top electrode. The aluminum is applied by vapor deposition in a conventional manner and the layer thickness is 30 nm.

The electroluminescent arrangement produced in this manner gives an orange-red light on application of a voltage of 87 V.

EXAMPLE 2

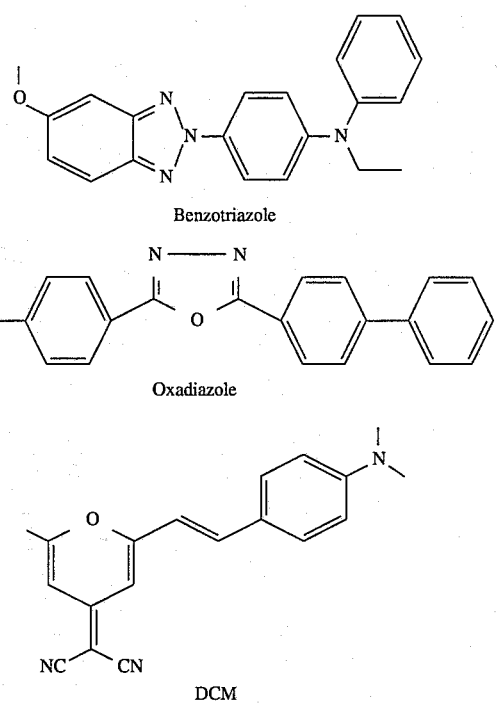

A solution of 0.1 g of the benzotriazole of the above formula and 0.4 g of poly-[vinyl cinnamate] in 17 ml of toluene is applied by spin coating to an ITO-coated glass substrate. The layer thus obtained is immediately crosslinked by exposure for 5 minutes to an HBO lamp. A solution of 0.01 g of DCM and 0.99 g of poly-[vinyl cinnamate] in 30 ml of toluene is then applied by spin coating to this layer and crosslinked by exposure to an HBO lamp.

The procedure is then repeated with a solution of 0.3 g of oxadiazole of the stated formula and 0.7 g of poly-[vinyl cinnamate] in 30 ml of toluene. The total thickness of all three layers is then 650 nm; they are then dried for one hour at 100° C. under reduced pressure in a drying oven.

An aluminum electrode is used as the top electrode, as in Example 1. Its layer thickness is 20 nm. The electroluminescent arrangement produced in this manner gives an orange-red light on application of a voltage of 93 V.

We claim:

1. An electroluminescent arrangement, containing one or more organic layers, wherein at least one of the layers is obtained by thermal or radiation-induced crosslinking and at least one charge-transporting compound is present per layer.

2. An electroluminescent arrangement, containing one or more organic layers which are obtained by thermal or radiation-induced crosslinking, wherein the layers contain at least one crosslinkable polymeric binder or at least one crosslinkable low molecular weight compound and additionally at least one charge transport compound containing groups which may be crosslinkable.

3. An electroluminescent arrangement as claimed in claim 2, wherein the crosslinkable polymeric binder or the crosslinkable low molecular weight compound contains groups capable of free radical, anionic or cationic crosslinking or groups capable of photocycloaddition.

4. An electroluminescent arrangement as claimed in claim 1, containing one or more organic layers which are obtained by thermal or radiation-induced crosslinking of charge-transporting compounds.

5. An electroluminescent arrangement as claimed in any of claims 1 to 4, having layers from 10 nm to 10 µm thick.

6. An electroluminescent arrangement as claimed in any of claims 1 to 4, wherein one or more layers are obtained by crosslinking with UV radiation.

7. An electroluminescent arrangement as claimed in claim 6, wherein the UV radiation used has a wavelength of from 200 to 450 nm.

8. An electroluminescent arrangement as claimed in any of claims 1 to 4, wherein one or more layers are obtained by crosslinking with electron beams.

9. An electroluminescent arrangement as claimed in claim 8, wherein the electron beams used have energies of 0.3–1 MeV.

10. An electroluminescent arrangement as claimed in any of claims 1 to 4, wherein tertiary aromatic amines, oxadiazoles, thiadiazoles, benzoxazoles, benzotriazoles, fused aromatic systems or polyene compounds are used as charge-transporting compounds in the layer or layers.

11. An electroluminescent arrangement as claimed in any of claims 1 to 4, wherein tertiary aromatic amines, oxadiazoles, thiadiazoles, benzoxazoles, benzotriazoles, phthalocyanines, fused aromatic systems or polyene compounds having groups capable of anionic, cationic or free radical polymerization are used as charge-transporting compounds in the layer or layers.

12. An electroluminescent arrangement as claimed in any of claims 1 to 4, wherein tertiary aromatic amines, oxadiazoles, thiadiazoles, benzoxazoles, benzotriazoles, phthalocyanines, fused aromatic systems or polyene compounds having groups capable of photocycloaddition are used as charge-transporting compounds in the layer or layers.

13. An electroluminescent arrangement as claimed in claim 11, wherein the charge-transporting compounds used are those having groups capable of free radical polymerization.

14. An electroluminescent arrangement as claimed in claim 13, wherein the charge-transporting compounds carry unsubstituted or substituted vinyl radicals as groups capable of free radical polymerization.

15. An electroluminescent arrangement as claimed in claim 14, wherein the unsubstituted or substituted vinyl radicals are vinylcarbonyl groups or contain these.

16. An electroluminescent arrangement as claimed in claim 12, wherein the groups capable of photocycloaddition contain the unsubstituted or substituted structural units

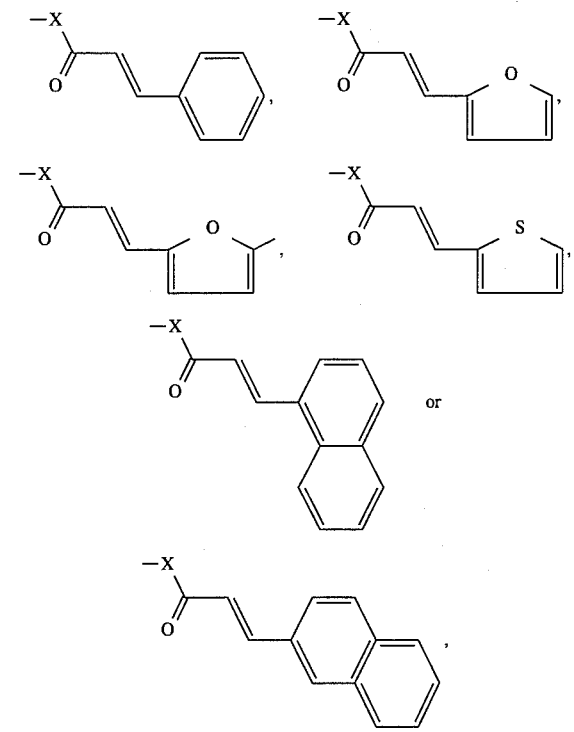

where X is O or NR and R is hydrogen or $C_1$–$C_6$-alkyl.

17. An electroluminescent arrangement as claimed in claim 10, wherein the tertiary aromatic amines used are triaryl-substituted compounds.

18. An electroluminescent arrangement as claimed in any of claims 1 to 4, wherein one or more layers are obtained by thermal crosslinking.

19. An electroluminescent arrangement as claimed in claim 18, wherein the thermal crosslinking is carried out at from 50° to 250°.

20. An electroluminescent arrangement as claimed in claim 18, wherein the thermal crosslinking is carried out at from 60° to 150° C.

* * * * *